(12) United States Patent
Costello et al.

(10) Patent No.: US 8,698,925 B2
(45) Date of Patent: Apr. 15, 2014

(54) COLLIMATOR BONDING STRUCTURE AND METHOD

(75) Inventors: Kenneth A. Costello, Union City, CA (US); Kevin J. Roderick, San Jose, CA (US); Edward Yin, Cupertino, CA (US); Douglas Fowler, San Jose, CA (US)

(73) Assignee: Intevac, Inc., Santa Clara, CA (US)

( * ) Notice: Subject to any disclaimer, the term of this patent is extended or adjusted under 35 U.S.C. 154(b) by 703 days.

(21) Appl. No.: 12/764,862

(22) Filed: Apr. 21, 2010

(65) Prior Publication Data

US 2011/0261239 A1 Oct. 27, 2011

(51) Int. Cl.
*H04N 3/14* (2006.01)
*H04N 5/335* (2011.01)

(52) U.S. Cl.
USPC ......... 348/294; 250/338.4; 257/443; 257/460

(58) Field of Classification Search
USPC ................. 348/294; 250/338.4; 257/443, 460
See application file for complete search history.

(56) References Cited

U.S. PATENT DOCUMENTS

| | | | |
|---|---|---|---|
| 4,687,922 A | 8/1987 | Lemonier et al. | |
| 5,495,141 A | 2/1996 | Thomas | |
| 5,501,893 A | 3/1996 | Laermer et al. | |
| 5,565,385 A * | 10/1996 | Rostoker et al. | 438/614 |
| 5,688,715 A | 11/1997 | Sexton et al. | |
| 5,734,200 A * | 3/1998 | Hsue et al. | 257/755 |
| 6,094,114 A * | 7/2000 | Mohwinkel | 333/247 |
| 6,285,018 B1 | 9/2001 | Aebi et al. | |
| 6,483,231 B1 | 11/2002 | Iosue | |
| 7,042,060 B2 | 5/2006 | Costello et al. | |
| 2005/0181538 A1 * | 8/2005 | Tsai | 438/108 |
| 2005/0258212 A1 * | 11/2005 | Costello | 228/60 |
| 2006/0043438 A1 * | 3/2006 | Holm et al. | 257/291 |
| 2006/0138322 A1 * | 6/2006 | Costello et al. | 250/305 |
| 2007/0205520 A1 * | 9/2007 | Chou et al. | 257/780 |
| 2009/0045478 A1 | 2/2009 | Hui | |
| 2009/0201291 A1 * | 8/2009 | Ziv et al. | 345/424 |

FOREIGN PATENT DOCUMENTS

| | | |
|---|---|---|
| EP | 2561675 A1 | 2/2013 |
| JP | 2013-529356 A | 7/2013 |
| KR | 2013-0051948 A | 5/2013 |
| WO | 2012/021182 A1 | 2/2012 |

OTHER PUBLICATIONS

Ludwig, D. E., "Multilayered Focal Plane Structures With Self-Aligning Detector Assembly," SPIE, Proceedings vol. 2745, Jun. 1996, pp. 149-158.
International Search Report and Written Opinion for PCT/US11/33496 dated Jan. 24, 2012.
International Preliminary Report on Patentability for PCT/US11/33496 dated Nov. 1, 2012.

* cited by examiner

*Primary Examiner* — Antoinette Spinks
(74) *Attorney, Agent, or Firm* — Nixon Peabody LLP; Joseph Bach, Esq.

(57) ABSTRACT

An image sensor is disclosed that includes a solid state semiconductor imager having a metallized catch pad, a collimator having a metallized layer that faces a sensor anode, the metallized layer joined with the metallized catch pad to form a metal bond between the solid state semiconductor imager and the collimator. Methods of making the joined solid state semiconductor imager and collimator assembly are also disclosed.

32 Claims, 5 Drawing Sheets

COLLIMATOR BONDING STRUCTURE AND METHOD

GOVERNMENT SUPPORT

This invention was made with Government Support under Contract No. W15P7T-06-D-E402 awarded by the Department of the Army and CACI Technologies, Inc. Subcontract No. S09-103910. The Government has certain rights in the invention.

BACKGROUND

1. Field

This invention relates to the field of bonding a collimator to an imager and, in particular, to using catch pads throughout the imaged area.

2. Related Art

Focal plane imaging sensors are well known for the purpose of acquiring an electronic image from a sensor array implemented on a semiconductor die. Exemplary imaging sensors include CMOS imaging arrays (hereinafter, CMOS imagers) and charge coupled devices (hereinafter, CCD).

Backthinning, removal of material from the backside of substrates, has been used to make the imaging sensors, particularly in the CCD applications. Performance advantages of backthinned sensors can include improved light sensitivity as a result of improved effective fill factor. When properly passivated by a method such as described in U.S. Pat. No. 5,688,715, the entirety of which is hereby incorporated by reference, backthinned CMOS sensors can demonstrate high sensitivity to UV light and low energy (~0.5 to 20 keV) electrons and low energy X-Rays (<~10 keV). The sensitivity to low energy electrons of backthinned CMOS sensors makes them particularly suitable for use in vacuum tubes as a video based image intensifier. U.S. Pat. No. 6,285,018 B1, the entirety of which is hereby incorporated by reference, details the use of a backthinned CMOS sensor in an electron-bombarded configuration. The backthinned CMOS sensor is mounted directly opposing a photocathode in a proximity-focused configuration.

Image intensifiers experience a modulation transfer function (MTF) degradation of sensor image associated with elastic scattering of electrons as the electrons strike the anode of the tube. In a proximity-focused tube, the scattered (including backscattered) electrons are attracted to, and re-impact the anode within a circle of radius equal to ~2× the tube gap. This effect, often referred to as "halo," is a particular problem when bright lights fall within the image intensifier field of view. There are a number of prior art approaches to minimize the impact of halo in image tubes incorporating a microchannel plate (MCP). U.S. Pat. No. 6,483,231 attempts to minimize halo in the cathode to MCP gap, and U.S. Pat. No. 5,495,141 attempts to minimize halo in the MCP to screen gap, the entireties of which are hereby incorporated by reference. However, in a tube without a microchannel plate, the image flux electrons lost in the collimator significantly reduce tube sensitivity. The glass draw technology described in U.S. Pat. No. 5,495,141 is typically limited to open area ratios on the order of ~80%. This estimate is roughly consistent with the statement that gain lost in the collimator can be regained by increasing the applied voltage from 6000 to 10000 V.

Differences in the coefficient of expansion between the glass used to manufacture MCP-like structures and the silicon of CMOS die make it impossible to maintain pixel level alignments between a glass collimator and an electron bombarded active pixel imager over normal environmental temperature ranges. Modern dry etch technology is now capable of producing highly anisotropic etched structures in silicon. One method used to generate such structures is described in U.S. Pat. No. 5,501,893, the entirety of which is hereby incorporated by reference. U.S. Pat. No. 7,042,060 B2, the entirety of which is hereby incorporated by reference, describes collimator structures made using modern semiconductor techniques. Collimators made using anisotropic dry etching can exceed 90% open area ratio. Due to the exact coefficient of thermal expansion match between a silicon collimator and the silicon of a typical CMOS imager, silicon is typically used as the collimator material.

One consequence of the anisotropic-etch approach, and the high associated open areas, is that the collimator lacks the structural rigidity found in an MCP. U.S. Pat. No. 5,501,893 discloses placing the collimator in close proximity to the screen. The collimator is supported at the edge and spaced a few microns from the surface of the phosphor screen. U.S. Pat. No. 7,042,060 B2 describes multiple approaches including the use of a monolithic collimator, an edge supported collimator and a collimator bonded over the full active area. Modern image intensifiers employ various means to control sensor gain over widely varying input light levels. Direct view sensors use a combination of duty cycle gating of the cathode to MCP voltage and MCP voltage control to achieve suitable output light levels. Consequently, the electrostatic environment between the output of the MCP and screen, seen by the collimator described in U.S. Pat. No. 5,501,893, is constant during normal operation. When collimators are used in proximity focused solid state imaging sensors that do not employ an MCP, gain control is primarily achieved via duty cycle gating of the cathode-anode voltage. Consequently, the collimator is exposed to the alternating electrostatic field associated with the gating voltage. The collimator is conductive in order to maintain a drift field in the channels of the collimator. Similarly, the collimator is maintained at the anode potential during duty cycle gating. The electric field between the collimator surface and the photocathode results in a physical force that attracts the two surfaces toward each other.

In proximity focused solid state imaging sensors, optimum image resolution is achieved by minimizing photoelectron time of flight. Time of flight is in turn minimized by maintaining tight spacing between the cathode and anode. Spacing is typically limited by the required operational voltage of the sensor (typically between 500 and 8000V). The net result of close spacing and a relatively high, alternating electric field present at the surface of the collimator is that significant movement can occur in an edge supported collimator. Experience has shown that in the geometries used in commercial EBAPS sensors, this movement can exceed 100 microns. Increasing sensor gap by 100 microns is sufficient to measurably degrade sensor performance. Placing an edge supported collimator in close proximity to the anode in a gated electric field can result in physical damage to both the collimator and the anode. Similarly, momentum transfer from the moving collimator is transferred to the outside of the sensor vacuum envelope resulting in a measurable acoustic signature that changes with sensor varying high voltage gating conditions.

U.S. Pat. No. 7,042,060 B2 discloses two approaches that can address both the physical damage and acoustic signature issues. The first approach generates a monolithic collimator via the use of area selective backside thinning. In practice, it is a costly process to develop and a difficult process to implement at high yield. The cost can be minimized by fabricating discrete collimators via established semiconductor methods and subsequently bonding known good collimators to known good backside thinned imagers.

The second approach requires the collimator to be bonded to the underlying solid state imager throughout the active imaging area of the sensor via the use of a bonding medium. In the case of proximity focused solid state imagers that use GaAs, InGaAs, InP or other semiconductor photocathodes, ultra high vacuum (UHV) compatibility constraints apply to an acceptable bonding medium. The bonding media must both exclusively be composed of low vapor pressure materials and be compatible with the high temperature bake-out profiles necessary to achieve UHV pressures. The bond is made between the collimator and the passivated surface (also referred to as passivated layer) of the back-side thinned semiconductor imager, and this passivation layer is required to achieve good collection of electrons generated near the back surface of the imager. In order to achieve the best possible performance, the passivation layer is quite thin (typically <~500 Angstroms). Consequently, any interaction or contamination of the surface of the backside thinned imager resulting from the presence of the bonding media during UHV thermal processing may result in performance degradation of the sensor. Compatibility of the bonding media with the passivation layer represents an additional constraint on the bonding media.

In view of the above, a method and system are required to bond the collimator to the solid state imager that does not suffer from these drawbacks.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, an image sensor is disclosed that includes a solid state semiconductor imager comprising a backside thinned pixel array sensor and having a passivated silicon surface wherein a portion of the passivated silicon surface includes a pixel array region; a silicon collimator; and a metal bond inside the pixel array region joining the passivated silicon surface of the solid state semiconductor imager to the silicon collimator.

The metal bond may be a thermo-compression bond between a metallized catch pad and metal layer.

The metal bond may be a brazed metallized catch pad and metal layer.

The metal bond may include a plurality of metal bonds interspersed on the passivated silicon surface.

The plurality of metal bonds may be interspersed inside and outside of the pixel array region.

According to another aspect of the invention, an image sensor is disclosed that includes a solid state semiconductor imager comprising a sensor anode and having a metallized catch pad inside a pixel array region; and a collimator having a metallized layer that faces the sensor anode, the metallized layer joined to the metallized catch pad to form a metal bond. The metallized layer on the collimator may be continuous or it may be patterned to leave metal only in the areas where bonds are to be formed.

The metallized catch pad may include a top metal layer, an adhesion layer and a barrier layer. The metallized catch pad may include a top metal layer and a barrier layer. The metallized catch pad may include a gold layer, a titanium layer and a SiOxNy layer.

The collimator may further include an adhesion layer between a collimator body of the collimator and the metallized layer.

The solid state semiconductor imager may further include a pixel array region, and the plurality of metallized catch pads may be positioned inside or both inside and outside of the pixel array region.

The solid state semiconductor imager may further include a pixel array region, and the plurality of metallized catch pads may be positioned inside and outside of the pixel array region.

The solid state semiconductor imager may be a backside thinned pixel array sensor having a passivated surface.

The metal bond may be formed by a thermo-compression process. The metal bond may be formed by a brazing process. The metal bond may be formed by a soldering process.

According to a further aspect of the invention, a method of making an image sensor is disclosed that includes aligning a collimator with a solid state semiconductor imager; and joining the collimator with the solid state semiconductor imager to form a metal bond between the collimator and the solid state semiconductor imager.

Joining the collimator with the solid state semiconductor imager to form the metal bond may include performing a thermo-compression process.

Joining the collimator with the solid state semiconductor imager to form the metal bond may include performing a brazing process.

Joining the collimator with the solid state semiconductor imager to form the metal bond may include performing a soldering process.

The method may also include depositing a barrier layer on the solid state imaging sensor; depositing an adhesion layer on the barrier layer; and depositing a top metal layer on the adhesion layer.

The method may also include depositing an adhesion layer on the collimator; and depositing a surface metal layer on the adhesion layer.

The solid state semiconductor imager may include a metallic catch pad and the collimator may include a metallized layer, and joining the collimator with the solid state semiconductor imager to form the metal bond may include joining the metallic catch pad and the metallized layer.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

According to embodiments of the invention, system and methods are provided for bonding a collimator to an underlying solid state semiconductor imager via a metal bond. The metal bond is formed between a metalized layer on the surface of the collimator that faces the sensor anode and a metalized catch pad on the surface of the solid state semiconductor imager. The catch pads are interspersed throughout the imaging array.

Metal bonds are advantageous because they avoid hydroscopic issues associated with some bonding materials such as Boron Oxide containing glasses (i.e., storage and subsequent UHV processing of the bonding anode assemblies is problematic because of the hydroscopic nature of the glass).

Degradation of sensor optical performance can be minimized by limiting the area of the catch pads to that required to reliably mechanically stabilize the collimator. Bond coverage of about 0.2% of the image plane area is sufficient to achieve more than ten times the adhesion strength required to resist the electrostatic forces present in the sensor during operation. It will be appreciated that bond coverage of more or less than 0.2% of the image plane area may be used. Catch pad coverage within the image array may range between about 0.002% and about 20% image plane coverage.

In addition, the spacing between the collimator and the solid state semiconductor imager should exceed the anticipated deflection under the electrostatic load. In one example, if the vertical deflection of the collimator in the span between isolated catch pad bonds is less than about 0.1 micron, a metal bond thickness of more than about 0.1 micron limits the residual deflection of the collimator so it does not result in an impact between the collimator and the underlying anode. A solid border may also be incorporated into the assembly to stiffen the sides of the collimator to limit vertical deflection on cantilevered collimator edges.

Figure 1:
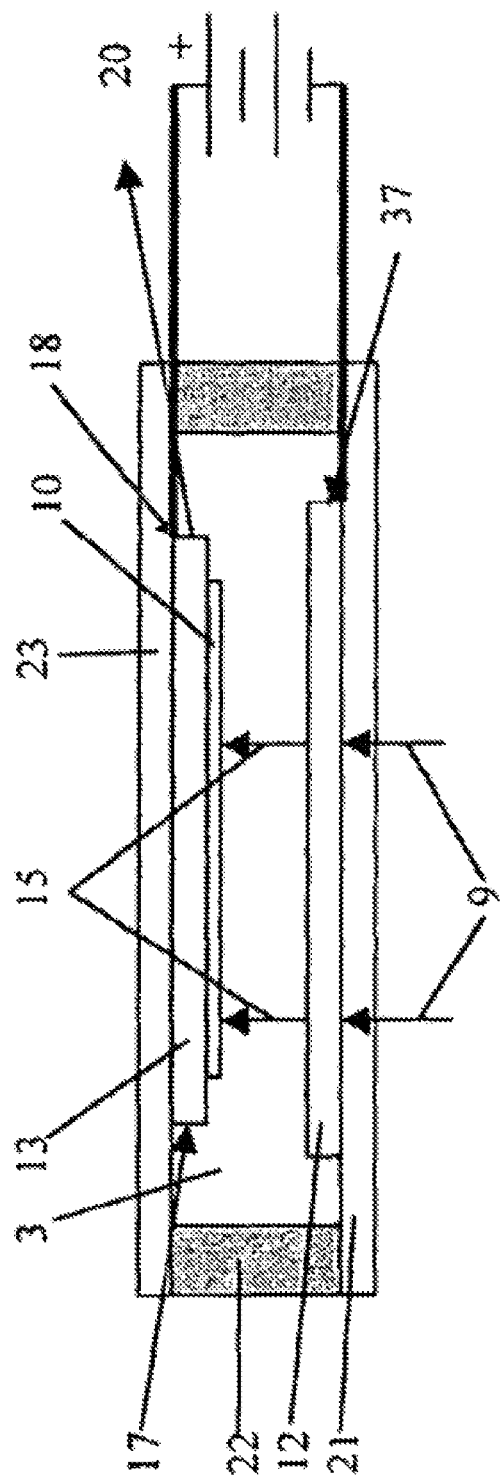
FIG. 1 is a schematic diagram showing an image sensor according to one embodiment of the invention.

An exemplary electron bombarded active pixel array component is shown in FIG. 1. In FIG. 1, the active pixel array component includes a vacuum enclosure 3 that houses a photocathode 12 in proximity focus with a specialized active pixel array sensor chip 13. The sensor chip 13 forms the anode for receiving proximity focused photoelectrons from the photocathode 12. The active pixel array sensor 13 is mounted with its backside facing the photocathode 12. In one embodiment, the backside of the substrate of the active pixel array sensor 13 is thinned. Thinning the backside of the substrate provides for a greater collection efficiency of the photoelectron excited carriers and reduces the crosstalk between pixels as a result of diffusion. The active pixel sensor array 13 may also include a passivated surface or layer. A collimator assembly 10 is mounted on the backside of the pixel array sensor chip 13. The collimator assembly 10 spatially filters scattered electrons from the sensor chip 13 thereby minimizing image artifacts and improving the modulation transfer function (MTF) of the photocathode based electron bombarded active pixel sensor.

The base of the vacuum device 3 is a transparent faceplate 21. The photocathode 12 is positioned on the faceplate 21. Vacuum enclosure sidewalls 22 extend between the transparent faceplate 21 and the header assembly 23. The active pixel sensor chip 13 is positioned on the header assembly 23. The header assembly 23 also allows for electrical feedthroughs for applying and reading back control voltages 17, bias voltage 18 and signal output lines 20 associated with the active pixel array sensor chip 13. Control electronics (not shown) are used to read out and operate the pixel array.

The photocathode 12 can be a GaAs, an InP/InGaAs, a transferred electron photocathode, a multi-alkali photocathode, or any other photocathode known to those skilled in the art. An electron accelerating voltage 37 is applied to the photocathode 12. Photoelectrons 15 are emitted from the photocathode 12 in response to incident light in the form of an optical image 9. Optical components (not shown) are typically employed to form the optical image on the photocathode 12. A projection system may be used to place the image on the photocathode 12.

An anode voltage 18 is applied to the sensor 13. The photoelectrons 15 are accelerated by virtue of the difference between the accelerating voltage 37 and the anode voltage 18. In one embodiment, the accelerating voltage 37 is negative with respect to the anode voltage 18. This permits biasing the sensor 13 to near (or at) ground potential to simplify interfacing with other components. Control signals and bias voltages 17 are applied to the active pixel sensor 3 and a video output signal 20 may be taken off the sensor 13.

The electron bombarded active pixel array sensor 13 is usefully employed in various systems, such as cameras, night vision imagers and the like. To that end, optical lenses or the like form an image of real objects on a focal plane which is ordinarily disposed to coincide with the photocathode 12. Under conditions of a sufficiently bright image, the focal plane is formed on the backside thinned surface of the pixel array and the bias may be adjusted to preclude the photoelectron flux 15 and operate in a conventional optical image regime. See, for example, U.S. Pat. No. 4,687,922, the entirety of which is hereby incorporated by reference. Taken together, the electron bombarded active pixel array component with optics, power supply and control electronics may be regarded as a camera system.

In one embodiment, the image sensor 13 includes an array of nominally 10 micron square pixels with center to center displacement of approximately 10 microns and a 50 micron (height) collimator 10. It will be appreciated that the dimensions of the image sensor 13 and the collimator 10 may be less than or greater than these exemplary dimensions.

Figure 2:
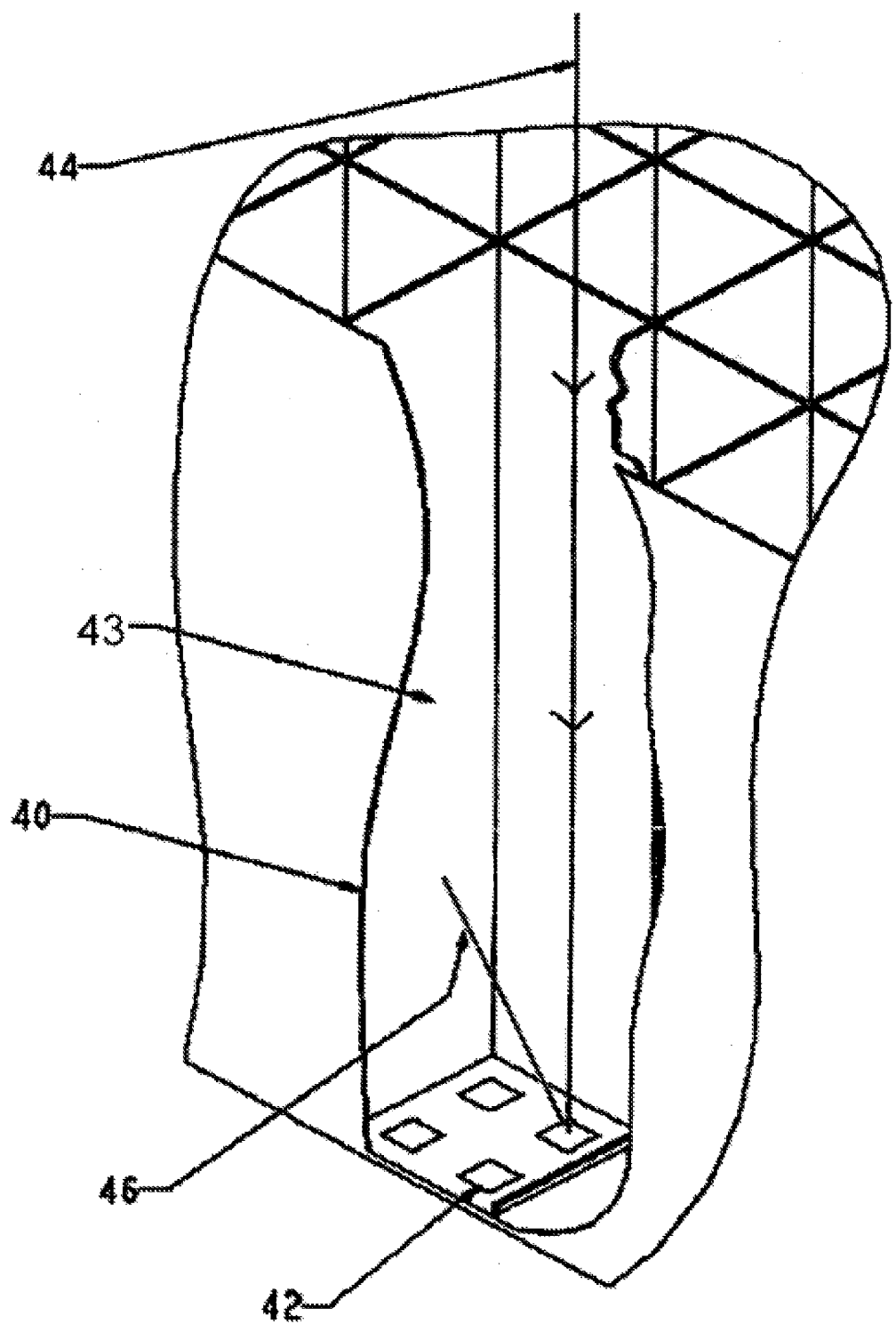
FIG. 2 is a perspective cross-sectional diagram showing the operation of an aligned collimator according to one embodiment of the invention.

FIG. 2 illustrates the operation of backside thinned sensor 13 and the collimator assembly 10 in further detail. As shown in FIG. 2, an elemental collimator 40 (i.e., an element of the collimator assembly 10) is aligned with the pixel array region 42, a four pixel sub-array. The four pixel sub-array 42 is disposed within and proximate the front side of the sensor chip 13. The collimator is aligned with the pixel array when the normal to the center of a pixel (or center of a group of pixels) is collinear with the long axis of the corresponding collimator.

An exemplary backscattered electron trajectory 46 is shown terminating on the interior walls 43 of the elemental collimator 40. But for the collimator 10, such backscattered electrons would excite pixels other than that pixel directly on the initial trajectory 44 of a proximity focused electron, thus degrading resolution and contributing artifact such as the halo effect. Thus, the collimator 10 functions as a baffle in respect to scattered electrons. The backscattered electrons are a relatively small effect and the halo effect, as such, becomes significant for very bright image features; however, the suppression of backscattered electrons is desirable because it is a source of background noise and veiling glare in the image sensor, resulting in reduced MTF.

The thermal budget of the solid state semiconductor anode imposes a constraint on the bond used to join the solid state imager 13 to the silicon collimator assembly 10. Standard CMOS imagers typically show signs of damage if peak processing temperatures exceed about 450° C. This 450° C. temperature limit makes the use of many active braze materials difficult. Thermo-compression bonds, brazes and solders typically do not bond well directly to a silicon surface. Accordingly, in embodiments of the present invention, a catch pad is provided on the solid state semiconductor imager to form a high reliability bond between the imager 13 and the collimator 10.

Figure 3:
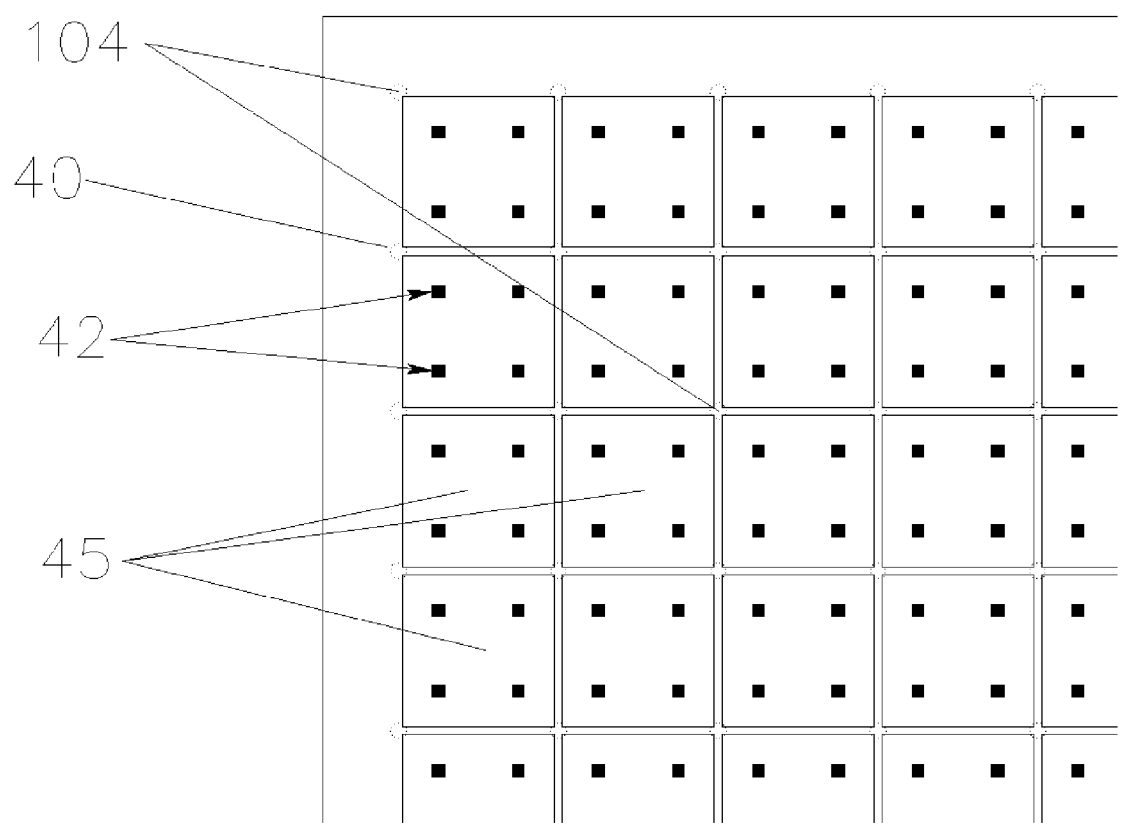
FIG. 3 is a top view of an aligned collimator assembly showing the location of bonds joining the collimator to the underlying solid state semiconductor imager according to one embodiment of the invention.

FIG. 3 is a detailed view of the exposed backside thinned, passivated semiconductor image array surface 45 illustrating an embodiment in which catch pads are used to form the high reliability bond. The catch pads 104 are deposited onto the backside, passivated surface 45 of the semiconductor image array. The catch pads 104, shown by dotted circles, are provided inside and outside of the pixel array region 42. The catch pads 104 are interspersed across the array surface 45.

In the illustrated embodiment, one catch pad is used for every four pixels. Consequently, a one megapixel imaging sensor employs on the order of 250,000 catch pads. The catch pads illustrated in FIG. 3 cover about 0.2% of the focal plane area. It will be appreciated that these numbers are exemplary and that the imaging sensor may include less than or more than 250,000 catch pads, and the catch pads may cover less than or more than 0.2% of the focal plane area. In one embodiment, the catch pads do not exceed about 50% pixel coverage for a single pixel.

Exemplary dimensions for the features of the image array surface are 10 micron pixel pitch, 40 micron collimator pitch, 1 micron collimator wall thickness and 4 micron diameter catch pads. It will be appreciated that these dimensions are only exemplary and that the dimensions may be less than or greater than the exemplary dimensions. The catch pad dimensions may be limited by the limitations of the existing lithography techniques. For example, currently available lithography techniques limit dimensions of the catch pads to about 0.1 microns. It will be appreciated that tradeoffs can be made between catch pad geometry and number. In one embodiment, the catch pads can take the form of a line segment that exceeds the collimator pitch so that there is a collimator wall intersection even if the collimator is not aligned to the underlying pixel area. For example, an alternate catch pad geometry is a 1 micron by 28.3 micron line segment aligned at a 45 degree angle to the pixel array.

The catch pads 104 may be deposited using known deposition techniques, such as, for example, atomic layer deposition (ALD), electro-plating, chemical vapor deposition (CVD) and physical vapor deposition (PVD) processes, and the like, and combinations thereof.

The collimator assembly 10, which includes a metallized surface, is then aligned and pressed into the catch pads 104. Thermal and pressure profiles are generated to generate a reliable metal bond between the collimator 10 and the image sensor 13. The pressure and temperature profile required to generate a reliable bond depends on the details of the metallization approach. In one example, gold to gold thermo-compression bond(s) may be used to join the collimator assembly 10 and the image sensor 3. In the case of gold to gold thermo-compression bonds, a temperature profile of 300° C. for 10 minutes at a pressure sufficient to yield approximately a 30% compression of the overall gold thickness resulted in reliable bonds.

Figure 4:
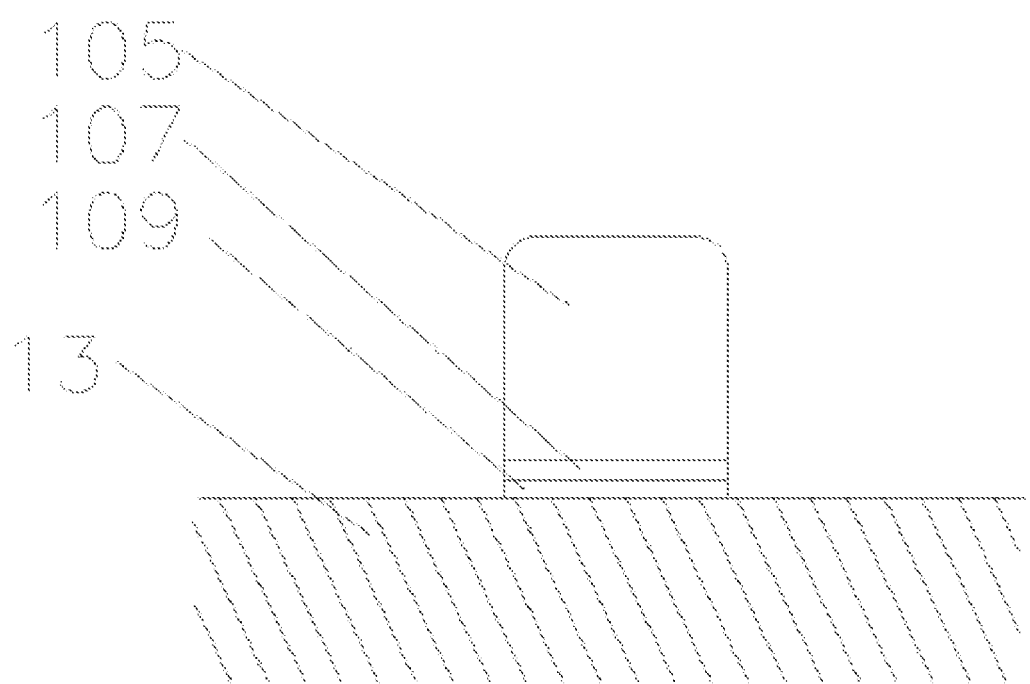
FIG. 4 is a detailed diagram showing the metal catch pad formed on the solid state semiconductor imager according to one embodiment of the invention.

FIG. 4 illustrates the catch pad layer structure in further detail. The catch pad 104 includes a top layer 105, an adhesion layer 107 and a barrier layer 109. The adhesion layer 107 is positioned between the top layer 105 and the barrier layer 109.

The top layer 105 is used to form the metal bond with the metallized layer of the collimator 10. The catch pad assembly 104 shown in FIG. 4 may be used with, for example, gold to gold thermo-compression bonding. In one embodiment, the top layer 105 is gold. It will be appreciated that other metals may be used as the top layer. For example, copper or silver can be cleaned to yield a reliable bond. It will be appreciated, however, that the malleable, relatively non-reactive nature of gold provides certain advantages over other metals. Exemplary dimensions of the top layer 105 are 2 microns in diameter and 2 microns thickness. It will be appreciated that the metal thickness, however, may be any thickness between about 0.2 to more than 5 microns. In one particular embodiment, the thickness is two microns, which is sufficient to overcome surface irregularities without imposing excessive difficulty for the use of lift-off lithography.

The adhesion layer 107 is provided to improve adhesion between the top layer 105 and the barrier layer 109. In one embodiment, the adhesion layer 107 is titanium. It will be appreciated that the adhesion layer 107 may be other reactive metal materials. Other exemplary materials include but are not limited to Chromium, Tungsten, Niobium, Vanadium, and the like, and alloys thereof (e.g., Ti—W). In one embodiment, the adhesion layer 107 is about 500 Angstroms thick. It will be appreciated that the thickness of the adhesion layer 107 may be less than or greater than 500 Angstroms.

The barrier layer 109 is provided to prevent the overlying metal layers 105, 107 from reacting with or excessively stressing the underlying passivated, backside thinned semiconductor image array 13. The barrier layer 109 protects the sensor surface throughout the thermal and pressure cycles required for bonding and any subsequent UHV processing. In one embodiment, the barrier layer 109 is approximately 1000 Angstroms and is made of $SiO_2$. Other exemplary materials that may be used for the barrier layer 109 include but are not limited to SiO, $SiO_xN_y$, $Al_2O_3$, and the like, and refractory metals, such as Tungsten, Molybdenum, Tantalum, Niobium, Platinum, and the like. It will be appreciated that the thickness of the barrier layer 109 may be less than or greater than 1000 Angstroms.

Typically, there is sufficient leakage to drain off the photocathode charge without the need for a discrete "grounding" contact; however, if the nature and thickness of the barrier layer 109 results in an electrically isolated bond, a path is provided to assure that the collimator remains at the potential of the underlying anode. One such path eliminates the barrier layer 109 for bonds that lie outside of the imaging area (but the barrier layer 109 remains for those bonds that lie within the imaging area).

It will be appreciated that in embodiments in which the barrier layer 109 is made of a refractory metal, the adhesion layer 107 and barrier layer 109 may be combined (i.e., a single layer may be deposited under the top layer 105).

It will be appreciated that the top layer 105, adhesion layer 107 and barrier layer 109 may be deposited using known techniques such as for example atomic layer deposition (ALD), electro-plating, chemical vapor deposition (CVD) and physical vapor deposition (PVD) processes, and the like, and combinations thereof.

Figure 5:
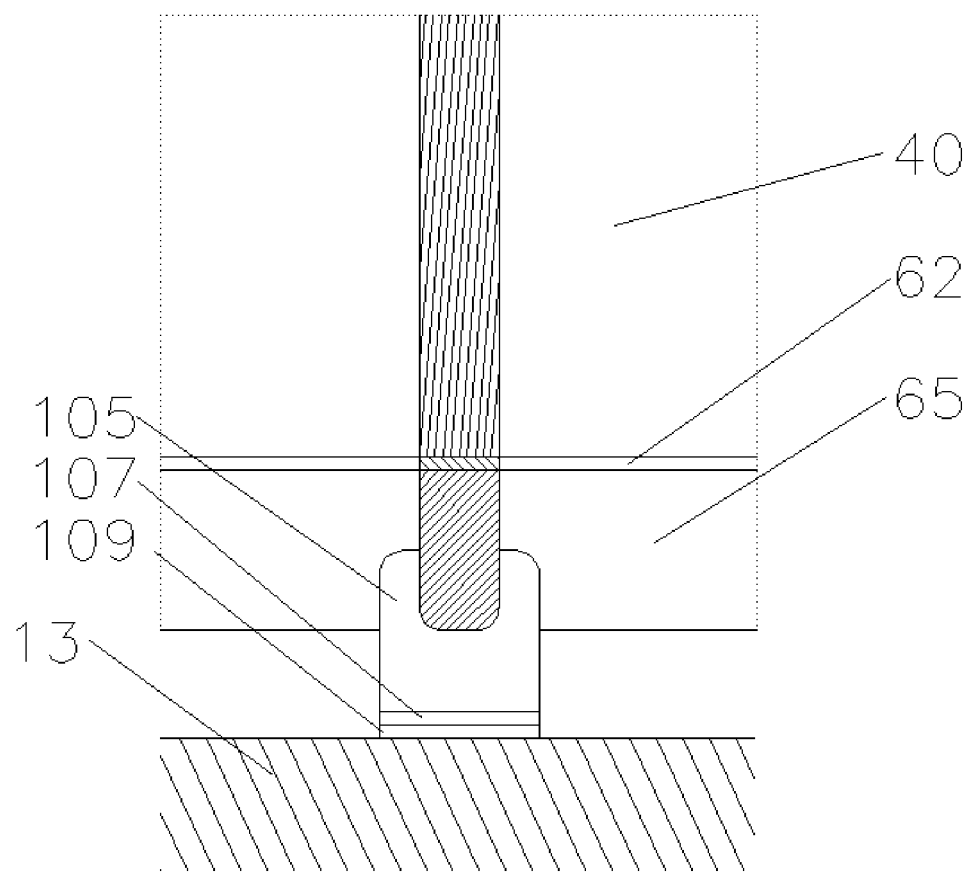
FIG. 5 is a schematic cross-sectional view of a collimator and imager assembly showing the metal bond and the collimator metallization according to one embodiment of the invention.

FIG. 5 illustrates the metal bond between the collimator 40 and the image sensor 13 in further detail. Two metal layers are deposited on the silicon walls of the collimator 40 so the collimator 40 can be joined with the catch pads 104. The two metal layers include an adhesion layer 62 and a surface layer 65.

The adhesion layer 62 improves adhesion between the surface layer 65 and the silicon collimator 40. In one embodiment, the adhesion layer 62 is Titanium and 500 Angstroms in thickness. It will be appreciated that the adhesion layer 62 may be made of any reactive metal. Other suitable materials include but are not limited to Chromium, Tungsten, Niobium, Vanadium, and the like, and alloys thereof (e.g., Ti—W). It will be appreciated that the thickness of the adhesion layer 62 may be less than or greater than 500 Angstroms.

In one embodiment, the bottom layer 65 is gold. Exemplary dimensions of the bottom layer 65 are 1 micron wide (e.g., the width of a collimator wall) and 2 microns thick. It will be appreciated that these dimensions are merely exemplary and that the dimensions may be less than or greater than these exemplary dimensions. In one embodiment, the full surface of the collimator 40 may be coated by the surface layer 65.

In FIG. 5, a residual separation is shown between the top of the free surface of the collimator (defined by layer 65) and the free surface of the imager 13. In one embodiment, the separation between the two surfaces is approximately 1 micron. This separation is sufficient to insure that residual movement of the collimator under gated proximity focused sensor operation does not result in imager damage. In the case of thermo compression bonds, geometry and pressure are primary factors in controlling the residual collimator-to-sensor gap in the regions between catch pads.

In the embodiment shown in FIG. 5 a thermo-compression bond is used to form the metal bond between the image sensor 13 and the collimator 10. A temperature of 300° C. for 10 minutes at a sufficient pressure can yield about a 10% to about a 50% compression of the overall gold thickness, which results in reliable bonds.

As described above, in other embodiments, the collimator 10 and image sensor 13 may be bonded using other bonding techniques such as, for example, brazing and soldering. In embodiments in which the collimator 10 and imaging sensor 13 are bonded using brazing, the layers 107 and 109 may be thickened to insure that a minimal residual collimator-to-sensor gap is maintained in the regions between the catch pads 104. In addition, the top layer 105 may instead be a braze alloy such as for example Au—Sn. In the example in which the top layer 105 is Au—Sn, the time and temperature of the bond may be set to allow inter-diffusion between the top layer 105 of the imaging sensor 13 and the bottom layer 65 of the collimator 40 to increase the melting point of the bond beyond that of the eutectic value. Braze metallizations that terminate in gold (Au) are advantageous because surface oxidation issues are avoided thereby improving braze reliability. Those skilled in the art of brazing can apply a wide variety of material systems to this bond while maintaining the disclosed geometry and meeting the constraints imposed by UHV processing. The small catch pad geometry (<~5 microns wide) is important when high modulus higher melting point braze alloys are used. Other suitable solder/braze alloys include but are not limited to Gold-Silicon, Gold-Germanium and Gold-Tin. Transient liquid phase (TLP) braze-formulations/thermal profiles may also be used.

Although all of the drawings depict catch pads that are aligned to the pixel array, the disclosed techniques and structures can also be used with an unaligned collimator structure. For example, a collimator structure that is hexagonal, and has a 17 micron pitch, 50 micron thick with a wall thickness of ~1 micron can be used in conjunction with 20 micron long, 2 micron wide catch pads, and the image sensor can be a backside thinned electron bombarded active pixel sensor with a 10.8 micron pixel pitch.

Pull testing confirmed the collimator adhesion strengths were within engineering limits. Elimination of anode damage due to collimator/anode impact and the reliability of the approach under repetitive gating load were demonstrated via extended gated high voltage reliability testing.

Acoustic testing confirmed that switching from an edge bonded collimator to an area bonded collimator results in >10× reduction of the sound pressure level generated by the sensor during high voltage gated operation. Whereas the sound level of the edge-bonded collimator could be readily characterized, the area bonded collimator sensor employing metal bonds as described above did not result in a measurable increase in sound pressure level over the noise floor of the measurement system.

Image testing of EBAPS sensors incorporating collimators bonded via metal bonds on catch pads showed the electron shadow of the collimator and catch pad are very stable over the life of the sensor. Catch pads and collimator wall thickness were designed such that individual pixel shadowing ranged from 0 to ~40%. Limiting pixel shadowing to this range combined with the stable nature of the shadowing allows image correction algorithms to reliably correct for any reduced gain on the affected pixels. Although aligning collimator geometry to pixel geometry still results in the best possible image sensor performance, the stability of the fixed pattern noise combined with image correction algorithms allows non-aligned catch pad and collimator geometries to be used with minimal performance degradation, which, in turn, lowers the capital equipment cost required to produce the bonded collimator anode assemblies.

In some embodiments of the invention, the bonding techniques disclosed herein can be used with front-surface electron sensitive read out integrated circuits (ROICs). In these embodiments, the underlying barrier layer may be omitted; the metal pads can rest directly on the SiOxNy barrier layer found in these sensors. Similarly, the catch pads on the front-side imagers can be built up from metal pads, providing direct electrical connection to the collimator.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:
1. An image sensor comprising:
   a solid state semiconductor imager comprising a backside thinned pixel array sensor and having a passivated silicon surface wherein a portion of the passivated silicon surface includes a pixel array region, having a plurality of pixels;

a silicon collimator having each elemental collimator aligned with a pixel sub-array; and a metal bond inside the pixel array region joining the passivated silicon surface of the solid state semiconductor imager to the silicon collimator; and wherein the metal bond comprises a plurality of metal bonds interspersed on the passivated silicon surface inside the pixel array region between the pixel sub-arrays;

wherein the metal bonds do not exceed 50% pixel coverage of a single pixel.

2. The image sensor of claim 1, wherein the metal bond comprises a thermo-compressioned metallized catch pad and metal layer.

3. The image sensor of claim 1, wherein the metal bond comprises a brazed metallized catch pad and metal layer.

4. The image sensor of claim 1, further comprising plurality of metal bonds interspersed outside of the pixel array region.

5. The image sensor of claim 1, wherein each of the individual metal bonds comprises a line segment aligned at a 45 degree angle to the pixel array.

6. The image sensor of claim 1, wherein one individual metal bond is provided for every four pixels.

7. The image sensor of claim 4, wherein the individual metal bonds interspersed on the passivated silicon surface inside the pixel array comprise barrier layer and the metal bonds interspersed outside of the pixel array region do not include barrier layer.

8. The image sensor of claim 1, wherein the metal bond comprises a gold-to-gold thermo-compression bond.

9. An image sensor comprising:
a solid state semiconductor imager comprising a sensor anode and having a pixel array region with a plurality of pixels and a plurality of metallized catch pads interspersed inside the pixel array region among the plurality of pixels; and a collimator having a metallized layer that faces the sensor anode, the metallized layer joined to the metallized catch pad to form a metal bond wherein the metal bonds do not exceed 50% pixel coverage of a single pixel.

10. The image sensor of claim 9, wherein each of the metallized catch pads comprises a top metal layer, an adhesion layer and a barrier layer.

11. The image sensor of claim 9, wherein each of the metallized catch pads comprises a top metal layer and a barrier layer.

12. The image sensor of claim 9, wherein each of the metallized catch pads comprises a gold layer, a titanium layer and a $SiO_xN_y$ layer.

13. The image sensor of claim 9, wherein the collimator further comprises an adhesion layer between a collimator body of the collimator and the metallized layer.

14. The image sensor of claim 9, further comprising plurality of metallized catch pads positioned outside of the pixel array region.

15. The image sensor of claim 9, wherein the solid state semiconductor imager is a backside thinned pixel array sensor having a passivated surface.

16. The image sensor of claim 9, wherein the metal bond is formed by a thermo-compression process.

17. The image sensor of claim 9, wherein the metal bond is formed by a brazing process.

18. The image sensor of claim 9, wherein each of the metallized catch pads comprises a top metal layer and an adhesion layer and some of the metallized catch pads also comprise a barrier layer, wherein a subset of the catch pads lack the barrier so that a path is provided to assure that the collimator remains at electrical potential of the sensor anode.

19. The image sensor of claim 9, wherein the metal bond comprises a gold-to-gold thermo-compression bond.

20. The image sensor of claim 9, wherein each of the plurality of metallized catch pads comprises a line segment aligned at a 45 degree angle to the pixel array.

21. The image sensor of claim 9, wherein the plurality of metallized catch pads comprises one individual metal bond provided for every four pixels.

22. A method of making an image sensor comprising:
aligning a collimator with a solid state semiconductor imager, wherein the imager comprises a passivated silicon surface with a pixel array region having a plurality of pixels;

forming a plurality of catch pads interspaced among the plurality of pixels within the pixel array region;

metalizing bottom surface of the collimator; and joining the bottom surface of the collimator with the plurality of catch pads of the solid state semiconductor imager to form a metal bond between the collimator and the solid state semiconductor imager, the metal bond positioned inside the pixel array region of the solid state semiconductor imager; and wherein the metal bonds do not exceed 50% pixel coverage of a single pixel.

23. The method of claim 22 wherein joining the collimator with the solid state semiconductor imager to form the metal bond comprises performing a thermo-compression process.

24. The method of claim 22 wherein joining the collimator with the solid state semiconductor imager to form the metal bond comprises performing a brazing process.

25. The method of claim 22 wherein joining the collimator with the solid state semiconductor imager to form the metal bond comprises performing a soldering process.

26. The method of claim 22, wherein forming a plurality of catch pads comprises:
depositing a barrier layer on the solid state semiconductor imager;
depositing an adhesion layer on the barrier layer; and
depositing a top metal layer on the adhesion layer.

27. The method of claim 22, wherein metalizing the bottom surface of the collimator comprises:
depositing an adhesion layer on the bottom surface of the collimator; and
depositing a bottom metal layer on the adhesion layer.

28. The method of claim 23 wherein one metallic catch pad is provided for each pixel sub-array.

29. The method of claim 22, wherein joining the collimator with the solid state semiconductor imager to form the metal bond comprises forming a gold-to-gold thermo-compression bond.

30. The method of claim 22, wherein joining the collimator with the solid state semiconductor imager to form the metal bond comprises heating the collimator with the solid state semiconductor imager to 300° C. and applying pressure.

31. The method of claim 22, wherein forming a plurality of catch pads comprises forming line segments aligned at a 45 degree angle to the pixel array.

32. The method of claim 22, wherein forming a plurality of catch pads comprises forming one individual metal bond for every four pixels.

* * * * *